(12) United States Patent
Meyer et al.

(10) Patent No.: US 11,862,582 B2
(45) Date of Patent: Jan. 2, 2024

(54) PACKAGE WITH ELEVATED LEAD AND STRUCTURE EXTENDING VERTICALLY FROM ENCAPSULANT BOTTOM

(71) Applicant: Infineon Technologies AG, Neubiberg (DE)

(72) Inventors: Thorsten Meyer, Regensburg (DE); Thomas Bemmerl, Schwandorf (DE); Martin Gruber, Schwandorf (DE); Martin Richard Niessner, Munich (DE)

(73) Assignee: Infineon Technologies AG, Neubiberg (DE)

( * ) Notice: Subject to any disclaimer, the term of this patent is extended or adjusted under 35 U.S.C. 154(b) by 106 days.

(21) Appl. No.: 17/502,084

(22) Filed: Oct. 15, 2021

(65) Prior Publication Data

US 2022/0165687 A1    May 26, 2022

(30) Foreign Application Priority Data

Nov. 24, 2020  (DE) ............... 10 2020 131 070.6

(51) Int. Cl.
*H01L 23/495*    (2006.01)
*H01L 23/00*    (2006.01)
*H01L 23/31*    (2006.01)
*H01L 21/56*    (2006.01)
*H01L 21/48*    (2006.01)

(52) U.S. Cl.
CPC .......... *H01L 23/564* (2013.01); *H01L 21/481* (2013.01); *H01L 21/4828* (2013.01); *H01L 21/56* (2013.01); *H01L 23/3121* (2013.01); *H01L 23/49541* (2013.01); *H01L 24/73* (2013.01); *H01L 24/92* (2013.01); *H01L 2224/73265* (2013.01); *H01L 2224/92247* (2013.01)

(58) Field of Classification Search
CPC . H01L 23/564; H01L 21/481; H01L 21/4828; H01L 21/56; H01L 23/3121; H01L 23/49541
USPC ....................................................... 257/666
See application file for complete search history.

(56) References Cited

U.S. PATENT DOCUMENTS

| 5,830,800 | A | 11/1998 | Lin |
| 6,306,685 | B1 | 10/2001 | Liu et al. |
| 9,607,860 | B2 | 3/2017 | Pai |
| 10,008,437 | B2 * | 6/2018 | Hayashi ............. H01L 23/3121 |
| 10,825,755 | B2 * | 11/2020 | Rivera-Marty ......... H01L 24/81 |
| 2010/0283136 | A1 | 11/2010 | Hsieh et al. |
| 2011/0221059 | A1 | 9/2011 | Tang et al. |

(Continued)

*Primary Examiner* — Caleb E Henry
*Assistant Examiner* — Dilinh P Nguyen
(74) *Attorney, Agent, or Firm* — Dicke, Billig & Czaja, PLLC (57) ABSTRACT

A package is disclosed. In one example, the package comprises a carrier, an electronic component mounted on the carrier, an encapsulant encapsulating at least part of the electronic component and at least part of the carrier and having a bottom side at a first vertical level. At least one lead is electrically coupled with the electronic component and comprising a first lead portion being encapsulated in the encapsulant and a second lead portion extending out of the encapsulant at the bottom side of the encapsulant. A functional structure at the bottom side extends up to a second vertical level different from the first vertical level.

16 Claims, 4 Drawing Sheets

(56) References Cited

U.S. PATENT DOCUMENTS

2012/0061819 A1     3/2012   Siemieniec et al.
2019/0311977 A1    10/2019   Lam
2020/0402894 A1*   12/2020   Luo .................. H01L 24/40

* cited by examiner

PACKAGE WITH ELEVATED LEAD AND STRUCTURE EXTENDING VERTICALLY FROM ENCAPSULANT BOTTOM

CROSS-REFERENCE TO RELATED APPLICATION

This Utility Patent application claims priority to German Patent Application No. 10 2020 131 070.6, filed Nov. 24, 2020, which is incorporated herein by reference.

BACKGROUND

Technical Field

Various embodiments relate generally to a package, an electronic device, and a method of manufacturing a package.

Description of the Related Art

Packages may be denoted as usually encapsulated electronic components with electrical connects extending out of the encapsulant. For example, packages may be connected to an electronic periphery, for instance mounted on a printed circuit board and/or connected with a heat sink, and may be connected via connectors to a larger system.

Packaging cost is an important driver for the industry. Related with this are performance, dimensions and reliability. The different packaging solutions are manifold and have to address the needs of a specific application.

Power may be mounted on a mounting base such as a printed circuit board (PCB). Issues concerning an electric and a mechanical coupling between package and mounting base may limit reliability and performance.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

There may be a need for a package with high reliability and high performance.

According to an exemplary embodiment, a package is provided which comprises a carrier, an electronic component mounted on the carrier, an encapsulant encapsulating at least part of the electronic component and at least part of the carrier and having a bottom side (or a bottom main face) at a first vertical level, at least one lead electrically coupled with the electronic component and comprising a first lead portion being encapsulated in the encapsulant and a second lead portion extending out of the encapsulant at said bottom side of the encapsulant, and a functional structure at said bottom side extending up to a second vertical level being different from (for instance being displaced downwardly or upwardly with respect to) said first vertical level.

According to another exemplary embodiment, an electronic device is provided which comprises a package having the above mentioned features, and a mounting base on which the package is mounted and being electrically coupled with the at least one lead.

According to yet another exemplary embodiment, a method of manufacturing a package is provided, wherein the method comprises mounting an electronic component on a carrier, electrically coupling at least one lead with the electronic component, encapsulating at least part of the electronic component and at least part of the carrier by an encapsulant which has a bottom side at a first vertical level, encapsulating only a first lead portion of the at least one lead in the encapsulant so that a second lead portion of the at least one lead extends out of (and in particular vertically beyond) the encapsulant at said bottom side of the encapsulant, and forming a functional structure at said bottom side extending up to a second vertical level which is different from said first vertical level. According to an exemplary embodiment, a package with an encapsulated electronic component mounted on a carrier is provided, wherein one or more leads electrically connecting said encapsulated electronic component may be configured as elevated lead(s) extending downwardly beyond a bottom main surface of the encapsulant. Such a lead configuration may ensure a highly reliable electric connection of the package with a mounting base (such as a printed circuit board) below, because the elevated one or more leads are highly appropriate for establishing a reliable electric connection with a connection medium (such as a solder connection medium) over a large connection area. For instance, a downwardly elevated lead may be covered with connection medium along its entire circumference and also at its bottom surface. As a result, a highly reliable electric and mechanical connection between package and mounting base can be ensured, which may yield a high performance of the package. Furthermore, an elevated lead design may keep electric paths short, and may thereby reduce signal losses and energy consumption of the package. Advantageously, an additional functional structure (which may comprise one or more functional sub-structures such as one or more extensions and/or one or more recesses) may be formed at a bottom side of the encapsulant to functionally cooperate with the elevated lead(s). Said functional structure may extend up to a vertical level which differs from another vertical level up to which the bottom main surface of the encapsulant extends. By such a functional structure, the properties of the package may be fine-tuned, in particular in terms of creepage distance adjustment and/or adjustment of connection medium wetting properties at the bottom side of the encapsulant. Thanks to such a functional structure, undesired creepage currents (for instance between different elevated leads and/or between an elevated lead and the carrier) may be strongly suppressed. It may also be possible to inhibit an unintentional solder flow into undesired regions of the package surface.

In the following, further exemplary embodiments of the package, the electronic device, and the method will be explained.

In the context of the present application, the term "package" may particularly denote an electronic member which may comprise one or more electronic components mounted on a carrier. Said constituents of the package may be optionally encapsulated at least partially by an encapsulant. For example, many packages may be manufactured simultaneously as a batch before being separated into individual packages.

In the context of the present application, the term "carrier" may particularly denote a support structure which serves as a mechanical support for the one or more electronic components to be mounted thereon. In other words, the carrier may fulfil a mechanical support function. Additionally or alternatively, a carrier may also fulfill an electrical connection function. A carrier may comprise or consist of a single part, multiple parts joined via encapsulation or other package components, or a subassembly of carriers. For instance, the carrier may be a die paddle.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated. Semiconductor chips implemented according to exemplary embodiments may be formed for example in silicon technology, gallium nitride technology, silicon carbide technology, etc.

In the context of the present application, the term "lead" may in particular denote an electrically conductive (for instance strip shaped) element (which may be straight or bent) which may serve for contacting the electronic component with respect to an exterior of the package. For instance, a lead may be partially encapsulated and partially exposed with respect to an encapsulant.

In the context of the present application, the term "encapsulant" may particularly denote a substantially electrically insulating and preferably thermally conductive material surrounding at least part of an electronic component and at least part of a carrier, as well as a part of the lead(s). For instance, the encapsulant may be a mold compound and may be created for example by transfer molding.

In the context of the present application, the term "bottom side" of the encapsulant may particularly denote a lower side of the encapsulant corresponding to a main surface of the encapsulant at which the package is mounted on a mounting base beneath. Hence, the bottom side is the side of the encapsulant through which the one or more leads extend for downwardly protruding beyond the encapsulant. Thus, the bottom side of the encapsulant corresponds to the electric connection side of the package.

In the context of the present application, the term "vertical level" may particularly denote a height level along a mounting direction of the constituents of the package and their arrangement during use of the package or the electronic device. In particular, the electronic component may be mounted on top of the carrier, and leads and/or the carrier of the package may be mounted on the mounting base. On the basis of or relative to this mounting or stacking direction, the various vertical levels may be defined. More specifically, the bottom side corresponding to the lower main surface of the encapsulant defines the first vertical level, whereas a bottom surface of the at least one bottom-sided exposed lead extends vertically below the first vertical level. Each functional sub-structure of the functional structure may extend up to a second vertical level which may be higher or lower than the first vertical level.

In the context of the present application, the term "functional structure" may particularly denote at least one structural feature at a bottom side of the encapsulant which may have an impact on the function of the package as a whole, and in particular an impact on the at least one elevated lead. For instance, the functional structure may be an electrically non-conductive structure, such as a dielectric protrusion or a recess. The functional structure may comprise one or more functional sub-structures such as one or more extensions and/or one or more recesses. In particular, said functional structure may have an electric function, a mechanical function and/or a thermal function. An example of an electric function of the functional structure is a prolongation of a creepage distance of a parasitic creepage current along a bottom surface of the encapsulant. An example of a combined mechanical and electrical function of the functional structure is the provision of a non-wettable surface portion along a bottom surface of the encapsulant on which a connection medium such as a solder material does not adhere. An example of a thermal function is the provision of a highly thermally conductive functional structure at a bottom side of the encapsulant which contributes to heat removal out of the package. One or more sub-structures of the functional structure with the same and/or different functions may be provided at the bottom side of the encapsulant.

In the context of the present application, the term "mounting base" may in particular denote a support body on which the package may be assembled, for instance together with one or more further packages. In particular, such a support body may be mechanically and electrically coupled with the package(s). In particular, the mounting base may be a plate-shaped electronic mounting base, such as a printed circuit board (PCB). An electric connection between mounting base and package may be established by a connection medium, such as a solder or sinter material.

In an embodiment, the package comprises a plurality of leads each electrically coupled with the electronic component and each comprising a first lead portion being encapsulated in the encapsulant and a second lead portion extending out of the encapsulant at a bottom side of the encapsulant. The encapsulated lead portions may conduct electric signals between an inside and an outside of the encapsulant, whereas the exposed portions may be configured for forming an electric and mechanically connection with a mounting base below the package. By the extension of the lead(s) out of the encapsulant at the bottom side rather than laterally, the connection length between the package and the mounting base may be reduced, which reduces signal losses and energy consumption. Furthermore, the downside elevation of the lead(s) may provide a large connection area between lead(s) and solder or sinter material.

In an embodiment, the functional structure comprises at least one extension extending downwardly from said bottom side or bottom main surface of the encapsulant. In other words, the second vertical level may be lower than the first vertical level. The extension may be a physical body protruding vertically beyond the bottom main surface of the encapsulant. In such a configuration, the functional structure may act for enlarging the isolation distance to inhibit creepage current flowing unintentionally along an exterior surface of the encapsulant. Hence, the functional structure may enlarge the isolation distance, meaning it may enlarge the distance from one electrode (for instance a lead) to another electrode (for instance another lead or a carrier) along the mold compound surface.

In an embodiment, the second lead portion of the at least one lead protrudes downwardly beyond the at least one extension. By configuring the at least one downwardly protruding functional structure to extend vertically not up to a lower end of the at least one downwardly elevated lead, any undesired interaction (for instance in terms of mounting the package on a mounting base) between the downwardly protruding lead(s) and the downwardly protruding functional structure may be avoided.

In an embodiment, the at least one extension forms part of said encapsulant. In other words, the at least one extension-type functional structure may be integrally formed with the encapsulant. In particular, the at least one extension-type functional structure may be made of the same material as the encapsulant. For instance, the functional structure may be configured as a mold protrusion or mold body extension of a mold-type encapsulant. This embodiment has advantages: On the one hand, the extension-type functional structure may be manufactured simultaneously with the encapsulation process, thereby rendering a separate manufacturing process dispensable for forming the functional structure. Furthermore, the mechanical integrity of the package is particularly stable if the functional structure is formed as part of the encapsulant rather than providing it as a separate piece. Thirdly, the intrinsic material properties of mold compounds used for encapsulating one or more electronic components of the package are highly appropriate for extending a creepage distance while being simultaneously non-wettable by solder.

In another embodiment, the at least one extension is made of another material and/or may be another body than said encapsulant, in particular may be made of a solder resist or other epoxy based material. An extension-type functional structure in form of a separate body made of another material than the encapsulant may be freely designed in accordance with its desired function. For instance, such an extension may be made of a highly thermally conductive material (for instance having a thermal conductivity of at least 5 W/mK or even at least 50 W/mK) for enhancing a cooling of the encapsulated electronic component. Also a solder resist is particularly well-suited as material of a separate extension body for reliably avoiding wetting by solder.

In yet another embodiment, the functional structure comprises at least one recess extending upwardly into the encapsulant from said bottom side or bottom main surface of the encapsulant. In such an embodiment, the second vertical level is located above the first vertical level. Forming a blind hole in the encapsulant at its bottom side may also extend a length of a trajectory along which a creepage current must flow between different electrically conductive elements of the package, and may therefore improve the electric reliability of the package. Furthermore, such a recess may inhibit a flow of solder material into undesired regions of the package.

In an embodiment, the package comprises a plurality of leads each electrically coupled with the electronic component and each comprising a first lead portion being encapsulated in the encapsulant and a second lead portion extending out of the encapsulant at said bottom side of the encapsulant. In particular, all leads of the package may extend out of the bottom of the encapsulant. This may contribute to a compact design of the package and may ensure short electric paths, thus low loss operation and low energy consumption of the package.

In an embodiment, at least one sub-structure of the functional structure is arranged laterally between different ones of the leads. Hence, the functional structure may spatially separate adjacent leads and may thereby promote the dielectric decoupling between said leads. This may contribute to an extension of a creepage length for thereby increasing the electric reliability of the package. Also an unintentional adhesion of solder at a bottom side of the encapsulant apart from the leads may be prevented by interposing a non-wettable functional structure between neighboured leads.

Preferably, isolation by the functional structure is not only provided to the carrier (for instance die paddle), i.e. between carrier and lead(s), but also between the leads.

In an embodiment, the carrier comprises a first carrier portion being encapsulated in the encapsulant and a second carrier portion extending out of the encapsulant at said bottom side of the encapsulant. When a part of the carrier facing the electronic component is arranged within the encapsulant, this may contribute to the electric reliability of the package. If however another part of the carrier extends out of the encapsulant, this has the following additional advantages: Firstly, the exposed carrier part may remove heat out of the package to thereby improve the thermal performance. Secondly, the exposed carrier part may be directly electrically connected with a mounting base, for instance by a solder connection. This keeps electric paths short and losses and energy consumption of the package small.

In an embodiment, at least one sub-structure of the functional structure is arranged laterally between the carrier and the at least one lead. Advantageously, a functional structure between an exposed part of the carrier and an exposed part of a lead may suppress creepage currents and may avoid unintentional wetting of non-soldered surface areas of the package.

In an embodiment, at least one sub-structure of the functional structure is configured for extending a creepage distance along an exterior surface of the encapsulant. An increased creepage distance may denote an increased length of a shortest path between two conductive materials (in particular between leads or between lead and carrier) measured along the surface of an isolator (in particular the encapsulant) that separates the conductors. Advantageously, the functional structure may prolong the creepage distance and may render a creepage trajectory more complex, thereby increasing the protection of the package against short-circuiting due to creepage current flow. Descriptively speaking, a creepage current flowing for instance between different leads at the bottom side of the encapsulant or flowing between such an elevated lead and an exposed portion of a metallic carrier may be extended by the functional structure, since that creepage current may then be forced to flow along an additional path along the functional structure.

In an embodiment, the functional structure is made of a material being non-wettable by solder material. For instance, a solder resist is highly appropriate for this purpose. In particular, such a solder resist may be a thin lacquer-like layer of polymer that may be applied in form of an elevated functional structure to prevent formation of solder bridges between closely spaced solder pads, leads and/or exposed areas of a metallic carrier. In this context, a solder bridge may denote an unintentional electrical connection between two conductors by solder material.

In an embodiment, the functional structure is a wall-shaped structure. For example, the functional structure may be of linear (for example straight) shape and may take the form of a ridge or barrier which must be overcome by a flow of solder, flux, sinter material, conductive or non-conductive glue or anisotropic adhesive into undesired surface regions at the bottom side of the encapsulant.

In an embodiment, the functional structure is an annular structure. In particular, a circular or rectangular arrangement of a mold elevation in ring form, surrounding the leads, may be advantageous, for instance at least one mold ring. When the functional structure circumferentially surrounds an inner bottom area of the encapsulant due to its closed ring shape, said area can be reliably protected by the functional structure with regard to the intrusion of undesired materials, such as flowable solder or moisture.

In an embodiment, the second lead portion extends out of the encapsulant exclusively at said bottom side. Thus, both the top side as well as the sidewalls of the encapsulant may be free of leads extending therethrough. All leads of the package may extend out of the bottom main surface of the encapsulant, and preferably all protruding beyond it. The entire electric connection of the package may then be accomplished at the bottom side, which further promotes the compact design of the package. The entire package apart from its bottom side may be continuously delimited by dielectric material of the encapsulant.

In an embodiment, the second lead portion, in particular the entire at least one lead, extends substantially vertically (preferably straight, rather than being three-dimensionally bent and comprising horizontal and vertical sections). The completely vertical extension of the one or more leads keeps electric connection paths short, limits losses and keeps the energy consumption of the package small.

In an embodiment, the second lead portion tapers from the bottom side of the encapsulant towards a bottom surface of the second lead portion. This may be the result of a manufacture of a bottom portion of the leads by an etching process, in particular an anisotropic etching process. In particular an inwardly curved or concave shape of the second lead portion may increase its connection area with solder or sinter material, thereby promoting a reliable and strong solder, glue or sinter connection.

In an embodiment, the carrier is electrically coupled with the electronic component. Hence, apart from serving as a mechanical carrier, the carrier may also establish an electric connection with the electronic component. This may allow to directly electrically connect a portion of the carrier extending beyond the encapsulant with a pad of the mounting base. For instance, the carrier may be metallic.

In an embodiment, a bottom surface of the at least one lead and a bottom surface of the carrier are coplanar, i.e. lie within the same plane. This promotes a proper mounting of the package on a flat mounting base, such as a printed circuit board (PCB).

In an embodiment, a top surface of the at least one lead and a top surface of the carrier are coplanar, i.e. lie within the same plane. Such a configuration allows to manufacture the carrier and the leads out of a metal plate which may only need to be patterned to form carrier and leads.

In another embodiment, a top surface of the at least one lead protrudes beyond a top surface of the carrier, in particular so that the top surface of the at least one lead is coplanar with a top surface of the electronic component, i.e. lie within the same plane. Preferably, the protrusion of a top surface of the one or more leads beyond a top side of the carrier may be identical or substantially identical to a thickness of the electronic component. With such a configuration, a planar electrically conductive connection element, in particular at least one clip, may be used for electrically coupling the top surface of the at least one lead with a top surface of the electronic component without the need of balancing out a height discrepancy. Such a clip may then be flat and may be connected to both a top side of the electronic component and a top side of the one or more leads. This results in a simple manufacturability and a compact design of the package.

In an embodiment, the carrier and the at least one lead form part of a common patterned metal sheet. Correspondingly, the method may comprise forming the carrier and the at least one lead by patterning a planar metal sheet, in particular by etching. Advantageously, the carrier and the at least one lead may be formed by a first partial etching of a top side of the metal sheet (preferably carried out before component assembly and encapsulation) and a second partial etching of a bottom side of the metal sheet (preferably carried out after encapsulation). Such a continuous metal sheet may firstly be half-etched at a top side before assembly of the component and before encapsulation. Thereafter, the metal sheet may be half-etched at a bottom side to thereby separate the metal plate into the carrier and the lead(s).

In an embodiment, the package comprises at least one electrically conductive connection element, in particular at least one bond wire or at least one clip, electrically coupling the electronic component with the at least one lead and being at least partially encapsulated by the encapsulant. As an alternative to a bond wire, it is also possible to use a bond ribbon.

In an embodiment, the at least one lead is pillar-shaped. This simplifies a wetting of the elevated lead portion with a solder or sinter material along the entire lead perimeter to thereby achieve a high electric connection area.

In an embodiment, the package is configured as leadless package. In a leaded package, all leads or terminals of the carrier may protrude laterally out of the encapsulant. In contrast to this, a leadless package does not have laterally extending leads, but connects the package at its bottom side to pads of a mounting base.

In an embodiment, the electronic device comprises an electrically conductive connection medium, in particular solder material, by which the mounting base is electrically coupled with the at least one lead. The connection medium between the package and the mounting base may for instance be a solder structure (in particular for diffusion soldering), a sinter structure (for instance comprising silver sinter material), or an adhesive (in particular an electrically conductive glue).

In an embodiment, the method comprises forming at least one top-side recess in an upper main surface of a metal sheet, thereafter mounting the electronic component on the metal sheet, thereafter encapsulating an upper portion of the metal sheet and at least part of the electronic component, and thereafter forming at least one bottom-side recess in a lower main surface of the metal sheet so that the at least one top-side recess and the at least one bottom-side recess are connected to form at least one through hole separating the metal sheet into the carrier and the at least one lead. Such a method is for instance illustrated in FIG. 4 to FIG. 6 and allows manufacturing the package in a simple way, by synergistically combining two half-etch processes to remove material of the metal plate at a top side and thereafter from a bottom side.

In an embodiment, the method comprises forming the at least one top-side recess with a tapering or stepped profile, at least partially filling said profile with encapsulant during encapsulating to thereby form the functional structure that as at least one extension of the encapsulant, and exposing the at least one extension by forming said at least one bottom-side recess. With a stepped and (towards a bottom side) spatially narrowing configuration of the top-sided recess in the metal plate, an extension-type functional structure may be integrally formed with the encapsulant protruding beyond its bottom main surface. Correspondingly, the extension-type functional structure or appendix may also be a tapering structure, for instance with a conical shape or as a truncated cone.

In an embodiment, the package comprises a plurality of electronic components mounted on the carrier or on different carriers. Thus, the package may comprise one or more electronic components (for instance at least one passive component, such as a capacitor, and at least one active component, such as a semiconductor chip).

In an embodiment, the electronic device comprises a mounting base on which the package is mounted and being electrically coupled with the lead(s) and/or with the carrier. Such a mounting base may be an electronic board serving as mechanical base for the package and being electrically couple-able with the lead(s) of the package.

In an embodiment, the carrier forms part of a metal plate or forms part of a leadframe. However, it is also possible that the carrier comprises a stack composed of a central electrically insulating and thermally conductive layer (such as a ceramic layer) covered on both opposing main surfaces by a respective electrically conductive layer (such as a copper layer or an aluminium layer, wherein the respective electrically conductive layer may be a continuous or a patterned layer). In particular, the carrier may be a Direct Copper Bonding (DCB) substrate or a Direct Aluminium Bonding (DAB) substrate. However, the carrier may also be configured as Active Metal Brazing (AMB) substrate, or as patterned metal plate (for example a leadframe).

Preferably, the at least one electronic component is a power semiconductor chip. For instance, a corresponding power semiconductor application may be realized by the chip(s), wherein integrated circuit elements of such a power semiconductor chip may comprise at least one transistor (in particular a field effect transistor such as a MOSFET (metal oxide semiconductor field effect transistor) or a bipolar transistor such as an IGBT (insulated gate bipolar transistor)), at least one diode, etc. It is also possible that the at least one electronic component comprises a controller circuit, a driver circuit, etc. One or more of these and/or other circuits may be integrated into one semiconductor chip, or separately in different chips. In particular, packages fulfilling a half-bridge function, a full-bridge function, etc., may be manufactured. In another embodiment, the at least one electronic component may be a logic die.

In an embodiment, the package is configured as power converter, in particular one of an AC/DC power converter and a DC/DC power converter. However, also other electronic applications, such as inverters, etc., may be possible.

As substrate or wafer for the semiconductor chips, a semiconductor substrate, in particular a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching, laser removal), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

According to an exemplary embodiment, a chip package is equipped with elevated lead(s) extending downwardly at the bottom side out of an encapsulant, wherein the latter is provided with a functional structure at said bottom side. The at least one downwardly protruding elevated lead may ensure a short electric path between the package and a mounting base supporting the package at its bottom mechanically and also providing an electrical coupling thereof. Consequently, the package may be manufactured in a simple and compact way. The functional structure extending for instance vertically (upwardly and/or downwardly) from the bottom side of the encapsulant fulfills at least one additional task which may be correlated with the elevated lead design without adding any noteworthy complexity neither to the package design nor the manufacturing method.

In particular, the at least one additional functional structure provided at the bottom side of the encapsulant and thus of the package may serve as a creepage distance extender. Additionally or alternatively, the functional structure may also have non-wetting properties in relation to solder material, thereby concentrating solder material to one or more wettable regions where a solder connection shall be established. Hence, the functional structure may reliably suppress undesired electrically conductive paths at the bottom side of the package. Preferably, an extension-type functional structure may be manufactured as an encapsulant appendix (for instance embodied as a mold barrier). Such a functional encapsulant appendix may be formed for example by partial etching processes applied to a metal plate. In particular, such an encapsulant appendix may be formed on the basis of a stepped mold profile. In another embodiment, a recess-type functional structure may be manufactured as an indentation extending into the encapsulant.

According to exemplary embodiments, a metal (in particular copper) sheet may be used as a basis for a chip package. The metal sheet may be structured by etching, for instance by half etching from an upper side or from a lower side. For example, the etching may be done from the bottom side for ease of etch chemistry flow. Thereafter, a (in particular chip-type) electronic component may be mounted on the metal sheet. The obtained arrangement may be wire bonded for electrically coupling the electronic component with the metal plate, and may be encapsulated (in particular molded). The metal sheet may then be structured from the other side, in particular by a further half etching process. By the second half etching process, the metal sheet may be separated into a carrier (functioning as die paddle) and into one or a plurality of downwardly extending leads. This may be accomplished by connecting top-sided recesses (formed by the first half etching) with bottom-sided recesses (formed by the second half etching) to thereby create through holes. Thus, the patterned sheet may form elevated or vertically extending leads for the semiconductor package. Advantageously, the patterned metal sheet may be encapsulated by a mold-type encapsulant and may for instance have an extended mold body extension on the bottom side.

Leadless packages are typically providing better electrical performance and smaller dimensions than leaded packages. A reason for this are shorter interconnects. On the other hand, the leads of a leadless package may be less reliable on board level. This causes many users to rely on leaded packages rather than on leadless packages, accepting the mentioned disadvantages.

In order to overcome such and/or other shortcomings of conventional packages, an exemplary embodiment provides a package which may be configured as leadless package, and which allows to improve the board level reliability.

Furthermore, reliability of a solder interconnect of a leadless package may be an issue. The fillet of the solder may wet the bottom side of the pad as well as the side wall of the package (for lead tip inspection (LTI)). The solder is therefore embedding the lead from bottom and one side only. Solder fatigue is thus a typical failure mode of board level testing. The low flexibility of the lead as well as the small interconnect area is providing a shortened board level reliability compared to other, for example leaded, packages. As a result, it may conventionally happen that only a small part of the pad is embedded in solder.

An exemplary embodiment provides a process flow enabling to manufacture elevated leads for a leadless package. Such elevated leads may be formed as pillars which may be embedded completely in solder. In particular, the lead may be supported from all five exposed sides by solder, leading to better board level reliability than for conventional leads.

A manufacturing method according to an exemplary embodiment may generate the elevated lead(s) for a large number of different leadless package outlines, like SON (Small-outline No-lead) Package, QFN (Quad Flat No Leads) Package, VQFN (Very Thin Quad Flat Non-Leaded) Package, etc.

In conventional approaches, the removal of the sidewall wetting may have a negative impact on reliability. The sidewall wetting can be artificially suppressed, and the resulting thermal cycling on board (TCoB) performance may drop significantly. Increasing the number of embedded sidewalls may therefore allow to improve the board level performance.

A gist of an exemplary embodiment is a process flow for a leadless package which results in elevated leads providing an improved board level reliability for leadless packages. As a result, compact leadless packages with improved electrical performance (due to shorter interconnect length) may be obtained which can replace leaded packages whenever the board level reliability is limiting the use of conventional leadless packages.

Figure 1:
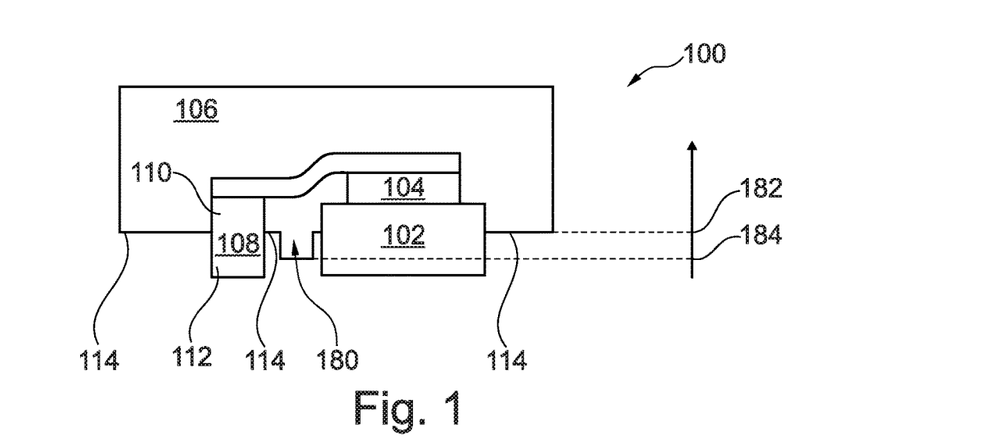
FIG. 1 illustrates a schematic cross-sectional view of a package according to an exemplary embodiment.

FIG. 1 illustrates a cross-sectional view of a package 100 according to an exemplary embodiment.

The illustrated package 100 comprises a carrier 102. An electronic component 104 is mounted on the carrier 102. Furthermore, an encapsulant 106 is provided which encapsulates the electronic component 104 and part of the carrier 102. The encapsulant 106 has a bottom side 114 at a first vertical level 182. A lead 108 is electrically coupled with the electronic component 104 and has a first lead portion 110 being encapsulated in the encapsulant 106 and a second lead portion 112 extending out of the encapsulant 106 at said bottom side 114 of the encapsulant 106. Moreover, a functional structure 180 is formed at said bottom side 114 of the encapsulant 106 and extends up to a second vertical level 184 which is different from said first vertical level 182.

Figure 2:
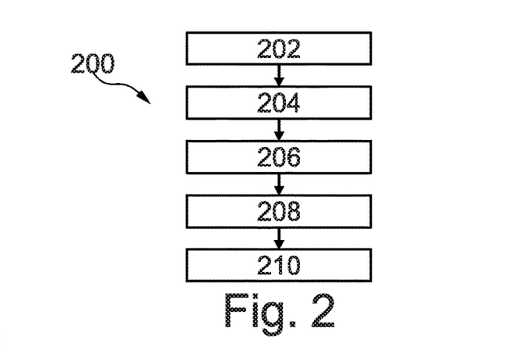
FIG. 2 illustrates a flowchart of a method of manufacturing a package according to an exemplary embodiment.

FIG. 2 illustrates a flowchart 200 of a method of manufacturing a package 100 according to an exemplary embodiment. The reference signs used for the following description of said manufacturing method relate to the embodiment of FIG. 1.

Referring to a block 202, the method comprises mounting an electronic component 104 on a carrier 102.

Referring to a block 204, the method further comprises electrically coupling a lead 108 with the electronic component 104.

Referring to a block 206, the method further comprises encapsulating the electronic component 104 and part of the carrier 102 by an encapsulant 106 which has a bottom side 114 at a first vertical level 182.

Referring to a block 208, only a first lead portion 110 of the lead 108 is encapsulated in the encapsulant 106. A second lead portion 112 of the lead 108 extends out of the encapsulant 106 at said bottom side 114 of the encapsulant 106.

Referring to a block 210, a functional structure 180 is formed at said bottom side 114 and extends up to a second vertical level 184 which is different from said first vertical level 182.

Figure 3:
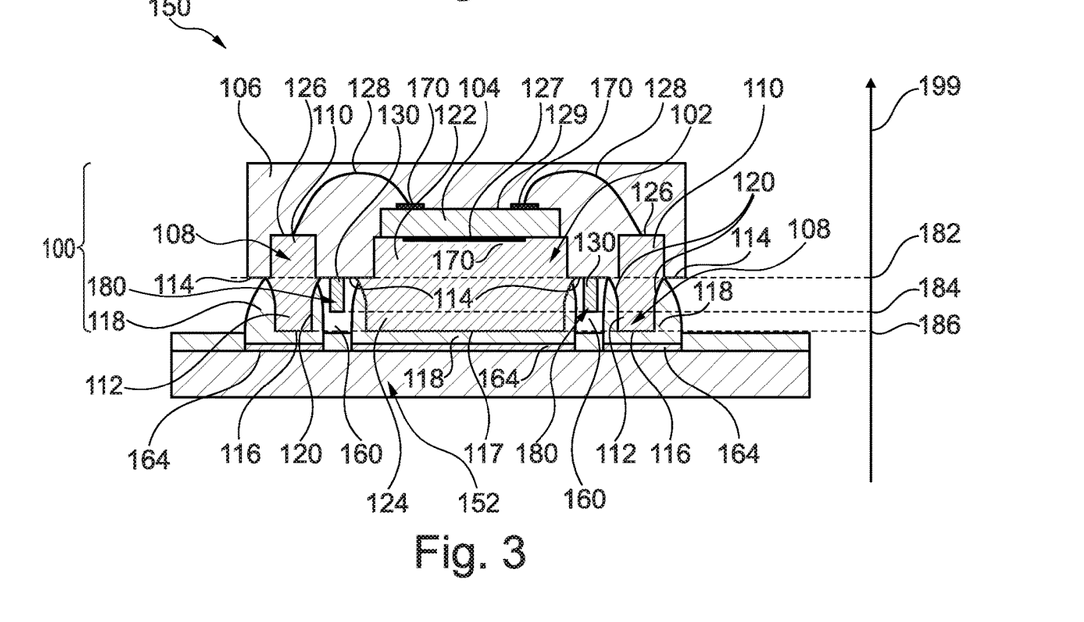
FIG. 3 illustrates a cross-sectional view of an electronic device comprising a package according to an exemplary embodiment and being mounted on a mounting base.

FIG. 3 illustrates a cross-sectional view of an electronic device 150 comprising a package 100 according to an exemplary embodiment and being mounted on a substrate or mounting base 152 at a bottom side. In the illustrated embodiment, package 100 is configured in a leadless package architecture.

The electronic device 150 is assembled in SMD technology and is composed of the semiconductor chip package 100 and the mounting base 152 at the bottom side of the electronic device 150 and below the package 100. The mounting base 152 may be embodied as a printed circuit board (PCB). The package 100 is mounted, for instance by soldering, on the mounting base 152 so that electrically conductive pads 164 of the mounting base 162 are electrically coupled with free ends of electrically conductive leads 108 extending downwardly beyond a mold-type encapsulant 106 of the package 100. An electrically conductive connection medium, such as solder structures, between the pads 164 on the one hand and the leads 108 and carrier 102 on the other hand, is shown in FIG. 3 with reference signs 118. The leads 108 are configured as vertically extending pillars and can therefore be wetted by the solder material fully circumferentially as well as at a free bottom surface 116. This ensures a proper electric and mechanical connection between the package 100 and the mounting base 152.

The electrically conductive leads 108 (for instance made of copper or aluminum) of the package 100 are electrically coupled with pads 170 of an electronic component 104 of the package 100 by electrically conductive connection elements 128. In the shown embodiment, the electrically conductive connection elements 128 are bond wires, but may be alternatively bond ribbons or clips (see for example FIG. 12) in other embodiments.

It is possible that the carrier 102 and the leads 108 form part of a common patterned metal plate, for instance in a leadframe configuration. In particular, carrier 102 may be partially or entirely electrically conductive. Contact areas of the leads 108 being electrically coupled with the mounting base 152 are all arranged on a lower side of the package 100.

As already mentioned, the carrier 102 and the leads 108 may be formed on the basis of a common planar metal plate. Alternatively, the carrier 102 may be a Direct Copper Bonding (DCB) substrate, a Direct Aluminum Bonding (DAB) substrate, or an Active Metal Brazing (AMB) substrate.

Electronic component 104 is mounted with its bottom pad 170 on one main surface (which may be denoted as a mounting surface) of the carrier 102, which is an upper main surface according to FIG. 3. For instance, the electronic component 104 may be a semiconductor chip, for example a power semiconductor chip. Said power semiconductor chip may comprise at least one integrated circuit element in a semiconductor body. Such at least one integrated circuit element may for example provide the function of a transistor (for instance of a MOSFET or an IGBT).

As shown, the package 100 may further comprise encapsulant 106 encapsulating the electronic component 104, the electrically conductive connection elements 128, part of the leads 108, and part of the carrier 102. However, another part of the leads 108 is exposed with respect to the encapsulant 106 to be electrically couplable with the mounting base 152, as shown and described above. Furthermore, another part of the carrier 102 is exposed with respect to the encapsulant 106 so as to be electrically coupled with the mounting base 152 as well. Preferably, encapsulant 106 is electrically insulating. For example, the encapsulant 106 may be a mold compound (or alternatively a soft encapsulant).

The encapsulant 106 has a bottom main surface or bottom side 114 which is arranged at a first vertical level 182. This is indicated at a vertical axis 199 shown in FIG. 3 and being directed upwardly.

Moreover, a functional structure 180 is formed at said bottom side 114 in form of two elevations 130 which extend from the bottom side 114 downwardly up to a second vertical level 184 which is below said first vertical level 182. As already mentioned, the functional structure 180 is embodied, according to FIG. 3, as extensions 130 extending downwardly from said bottom side 114 of the encapsulant 106 and protruding vertically beyond it. As shown, the second vertical level 184 is below the first vertical level 182. According to FIG. 3, the extensions 130 are separate from the encapsulant 106 and may be made of another material than said encapsulant 106. In the shown embodiment, at least the exposed surface of the extensions 130 may comprise a solder resist which functions as an anti-wetting surface on which solder material of the electrically conductive connection medium 118 cannot adhere. The extensions 130 are positioned in through holes 160 of a metal plate being patterned for separating the carrier 102 with respect to the leads 108.

As can be taken from FIG. 3, each of the leads 108 is electrically coupled with the electronic component 104 by bond wire-type electrically conductive connection elements 128 and comprises a first lead portion 110 being encapsulated in the encapsulant 106 and a second lead portion 112 extending out of the encapsulant 106 at said bottom side 114 of the encapsulant 106. Hence, the second lead portions 112 are exposed with respect to the encapsulant 106. Free end portions of the leads 108 protrude vertically downwardly even beyond the extensions 130 up to a third vertical level 186 which is lower than the first vertical level 182 and lower than the second vertical level 184. As a result, the extensions 130 do not disturb a process of connecting the leads 108 and the carrier 100 to the mounting base 152 by soldering.

As illustrated, the second lead portions 112 of all leads 108 extend out of the encapsulant 106 exclusively at said bottom side 114 and substantially vertically. The sidewalls of the package 100 are therefore exclusively constituted by the encapsulant 106 and are free of electrically conductive material. This further improves the electric reliability of the package 100. More specifically, the second lead portions 112 slightly taper from the bottom side 114 of the encapsulant 106 towards the bottom surface 116 of the second lead portions 112. This tapering forms a curved or concave geometry at sidewalls 120 of the leads 108 which may increase the wetting area of the solder.

As shown as well, the extensions 130 of the functional structure 180 are arranged laterally between different ones of the leads 108 for acting as a barrier for preventing an undesired migration of medium between different leads 108. In particular, liquid or moisture may be prevented from flowing between leads 108 and avoids short-circuiting. Thus, the functional structure 180 may function as a barrier against creepage current and may render a creepage distance larger as well as a creepage path more complex. Apart from this, the barrier function of the functional structure 108 also suppresses an undesired solder flow away from the leads 108.

As can be taken from FIG. 3 as well, the carrier 102 comprises a first carrier portion 122 being encapsulated in the encapsulant 106 and a second carrier portion 124 extending out of the encapsulant 106 at said bottom side 114 of the encapsulant 106. In the shown embodiment, both carrier portions 122, 124 form part of the same metal plate. Advantageously, the elevations 130 of the functional structure 180 are arranged laterally between the carrier 102 and the leads 108 for acting as barrier for suppressing a parasitic migration of medium between a respective lead 108 and the carrier 102. For instance, it may be avoided that humidity short-cuts a lead 108 and the carrier 102 so that the functional structure 108 serves as barriers inhibiting creepage current flow. In addition, the barrier function of the functional structure 180 also avoids a flow of solder between the leads 108 and the carrier 102.

Figure 4:
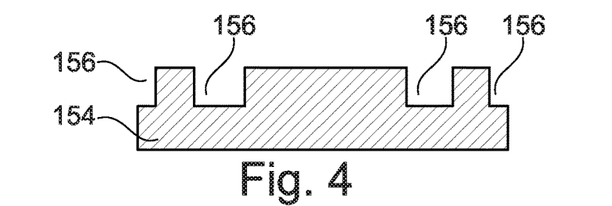
FIG. 4 to FIG. 6 show cross-sectional views of structures obtained during carrying out a method of manufacturing a package according to an exemplary embodiment.
Figure 6:
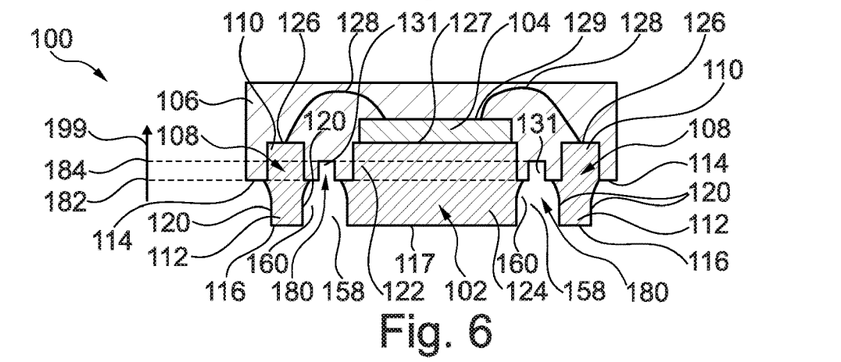

Since the carrier 102 and the leads 108 are formed on the basis of a flat metal plate being patterned by a half etching process from the top side followed by a further half etching process from the bottom side (in a similar way as shown in FIG. 4 and FIG. 6) during the manufacturing process, bottom surface 116 of the leads 108 and a bottom surface 117 of the carrier 102 are coplanar and both lie within a horizontal plane. Correspondingly, a top surface 126 of the leads 108 and a top surface 127 of the carrier 102 are coplanar as well and both lie within another horizontal plane. This patterned plate design contributes to the compactness of the package 100.

Simulations have shown that the embodiment of FIG. 3 may achieve a reduction of the accumulation of creep strain (wherein a volume may be averaged over control volumes)

during a last thermal cycle by for instance 60% compared to a conventional lead configuration.

Figure 5:
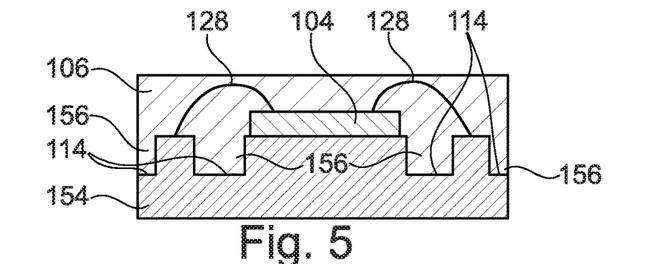

FIG. 4 to FIG. 6 show cross-sectional views of structures obtained during carrying out a method of manufacturing a package 100, shown in FIG. 6, according to another exemplary embodiment.

Referring to FIG. 4, a metal sheet 154 may be used as a starting point for the manufacturing process. Optionally, selective plating (for instance silver plating) can be performed on the metal sheet 154 in order to prepare areas where wire bonding is later performed on the leadframe-type metal sheet 154. Afterwards, the metal sheet 154 may be structured from the top side, for instance by structured wet etching. More specifically, a structured copper etch may be carried out from the top side only. As a result, a plurality of top-side recesses 156 are formed in an upper main surface of the flat metal sheet 154, for instance a copper plate. This may be accomplished by a first half etching process. This way, a central die paddle or carrier 102 as well as leads 108 for the wire bonds (for example silver pre-plated) or clip bonds may be generated as top-sided elevations in the metal sheet 154. The bottom of the metal sheet 154 remains unchanged at the present stage of the manufacturing process, especially remains a closed layer with a planar lower surface.

Referring to FIG. 5, die attach, wire bonding and molding processes may be carried out. More specifically, an electronic component 104 (such as a power semiconductor chip, for instance a field effect transistor chip) may be mounted on a central portion of the half-etched metal plate 154 which will later form the carrier 102. Hence, a die-type electronic component 104 may be attached to the patterned metal sheet 154 on the portion functioning as die paddle. This can be done for example by solder paste print and die attach and a following reflow, or by other die attach methods like glue die attach, sinter die attach or diffusion soldering.

Thereafter, the lateral portions of the patterned metal plate 154 which will later form the leads 108 may be electrically coupled with the electronic component 104 by connecting electrically conductive connection elements 128, which are here embodied as bond wires. Also a clip for source pad or source pad and gate pad can be attached, e. g. by soldering. In case of implementing a source clip only, the gate contact can be wire bonded. For wire bonded interconnects, a selective plating may be carried out on the leadframe-type metal plate 154. For instance, this can be the layer which has been applied before the first copper etch. Now the drain, source and gate of the die may be connected to the patterned metal sheet 154.

After that, the electronic component 104, the electrically conductive connection elements 128, and an upper portion of the patterned metal plate 154 which will later constitute the carrier 102 and the leads 108 may be encapsulated by an encapsulant 106. A bottom side 114 of the encapsulant 106 is defined by the bottom surface of the blind hole-type recesses 156 and is located at first vertical level 182 (compare FIG. 6) of the readily manufactured package 100. For instance, a molding process (in particular map molding, compression molding) may be performed for encapsulation. The created encapsulant 106 may embed the die(s) constituting the at least one electronic component 104 and the wires and/or clips on the metal sheet 154.

Referring to FIG. 6, a bottom side structured copper etch may be carried out, optionally accompanied by electroless plating for promoting wettability. More specifically, the manufacturing method may be continued for forming bottom-sided recesses 158 in a lower main surface of the metal sheet 154. The bottom-sided recesses 158 may be formed at positions ensuring that the top-side recesses 156 and the bottom-side recesses 158 are connected to form through holes 160 separating the metal sheet 154 into the carrier 102 and the leads 108. Hence, the carrier 102 and the leads 108 may be created by patterning planar metal sheet 154 by etching, more specifically by two subsequent half etching processes carried out from the top side and subsequently from the bottom side of the metal sheet 154.

Thus, the bottom side of the metal sheet 154 is structured for separating carrier 102 and leads 108. This can be done by using an etch resist and selective copper etching. Advantageously, the copper is not removed at the positions of the leads 108, leading to elevated leads 108 in form of second level copper pillars. These pillar-type leads 108 are protruding out of the mold body constituting the encapsulant 106. Advantageously, said pillar-type leads 108 may be completely embedded in solder paste during board level assembly and may be completely embedded in solder after the second level assembly.

In order to achieve particularly pronounced wettability, the leads 108 can be optionally plated with a noble pad finish, such as tin (Sn) or palladium (Pd) or nickel-gold (NiAu). Also the leads 108 can be coated with an organic surface protect (OSP).

After that, it may be possible to form recesses 131 as functional structure 180 at said bottom side 114 of the encapsulant 106 extending upwardly up to a second vertical level 184 being above said first vertical level 182. More specifically, the empty recesses 131 extend upwardly from the bottom side 114 into the encapsulant 106. In comparison with the embodiment of FIG. 3, the package 100 according to FIG. 6 does not implement downwardly protruding extensions 130 as functional structure 180, but in contrast to this upwardly protruding recesses 131. Recesses 131 may for instance be formed by etching, laser processing or mechanically drilling for removing material of the encapsulant 108 starting from its bottom side 114.

Figure 7:
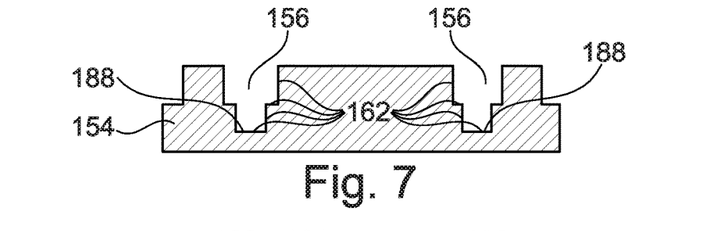
FIG. 7 to FIG. 9 show cross-sectional views of structures obtained during carrying out a method of manufacturing a package according to a preferred exemplary embodiment.
Figure 8:
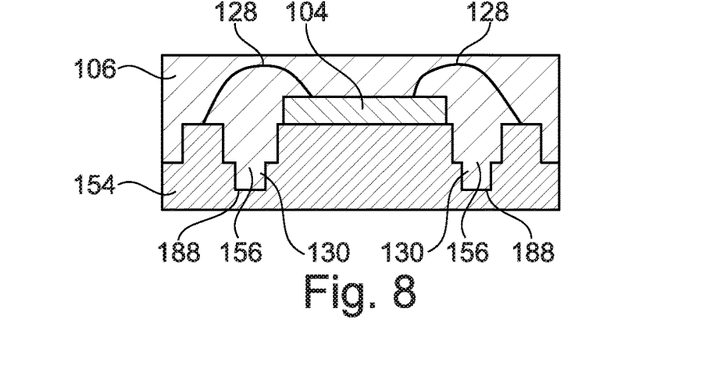
Figure 9:
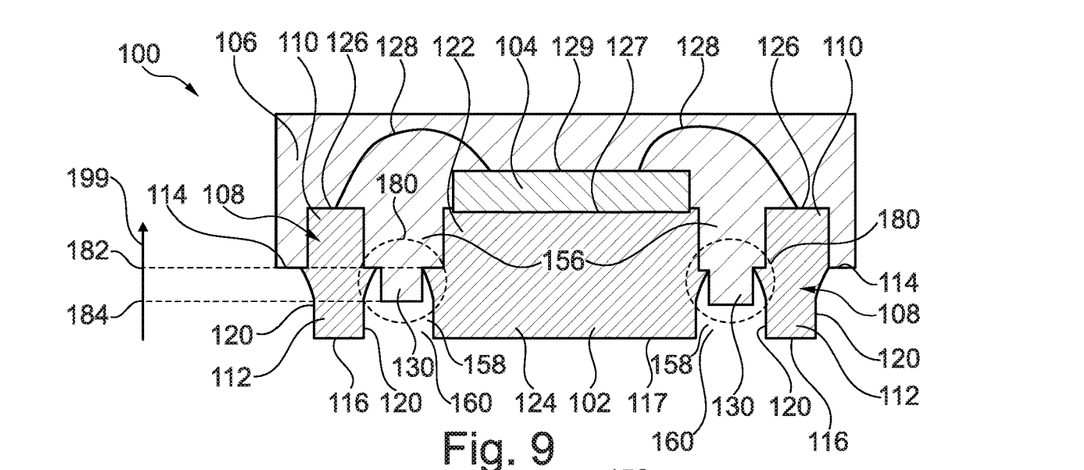

FIG. 7 to FIG. 9 show cross-sectional views of structures obtained during carrying out a method of manufacturing a package 100, shown in FIG. 9, according to still another exemplary embodiment.

Referring to FIG. 7, the top-side recesses 156 are formed in metal plate 154 with a stepped profile 162 which narrows towards or at a bottom 188 of the stepped recesses 156. This can be accomplished by correspondingly designing the half etching process of treating the metal plate 154 at its top side. Referring to FIG. 8, said stepped profile 162 is filled with material of encapsulant 106 during encapsulating to thereby form narrowed extensions 130 as bottom-sided appendices of the (for instance mold-type) encapsulant 106. Encapsulation is carried out after component assembly on a preform of carrier 102 and after connection of the assembled electronic component 104 with the preforms of the leads 108 by electrically conductive contact elements 128, as described above referring to FIG. 5. Referring to FIG. 9, said mold extensions 130 may be exposed by forming said bottom-side recesses 158 by half etching of the metal plate 154 from its bottom side.

In the preferred embodiment of package 100 according to FIG. 9, the extensions 130 form part of and are integrally formed with said encapsulant 106. Hence, the extensions 130 according to FIG. 9 may also be denoted as mold body extensions. The shown functional structure 180 embodied as extensions 130 protruding vertically beyond the bottom side 114 of the encapsulant 106 but not up to the bottom surface 116 of the leads 108 spatially separate the carrier 102 with respect to the leads 108 and also spatially separate the leads 108 from each other without causing an undesired interaction with the solder connection between the second lead portions 112 and the mounting base 152 by solder-type electrically conductive connection medium 118. The dielectric mold extensions 130 can be manufactured substantially without additional manufacturing effort and are intrinsically rigidly connected with the rest of the encapsulant 106. Furthermore, the mold extensions 130 increase the creepage distance between carrier 102 and leads 108 as well as between different leads 108 and also function as non-wettable solder barrier. For example, the extensions 130 may be straight or curved walls extending into the paper plane of FIG. 9 or may be a circumferentially closed annular structure.

The preferred embodiment of FIG. 9 shows an advantageous package 100 with a mold body being extended at a bottom side 114. In this embodiment, the base leadframe in form of the metal plate 154 is structured in a way that more than one depth level (at leadframe top side) will result in the illustrated extended mold body structure after bottom side structuring of the metal plate 154. The elevated mold body material in form of the extensions 130 may serve as barrier in between adjacent pads or leads 108, which may be an enabler for a higher creepage distance on the one side, and which may simultaneously ensure a robust device mounting quality, as the extended mold body advantageously disables solder shortage. The extended mold body may result in an enhanced creepage distance and an improved barrier for solder shortage between adjacent leads 108 or pads.

Figure 10:
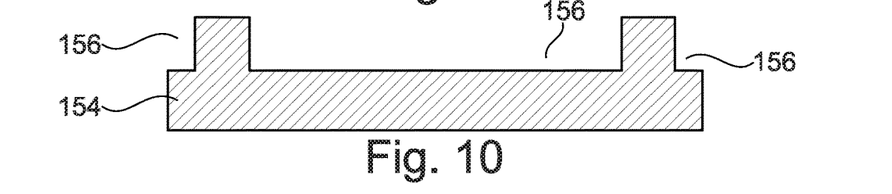
FIG. 10 to FIG. 12 show cross-sectional views of structures obtained during carrying out a method of manufacturing a package according to still another exemplary embodiment.
Figure 11:
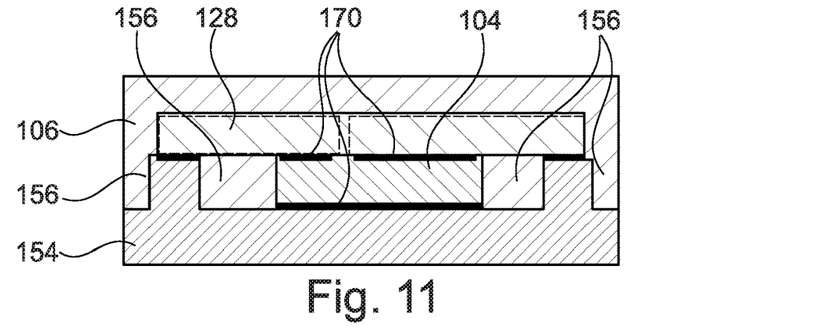
Figure 12:
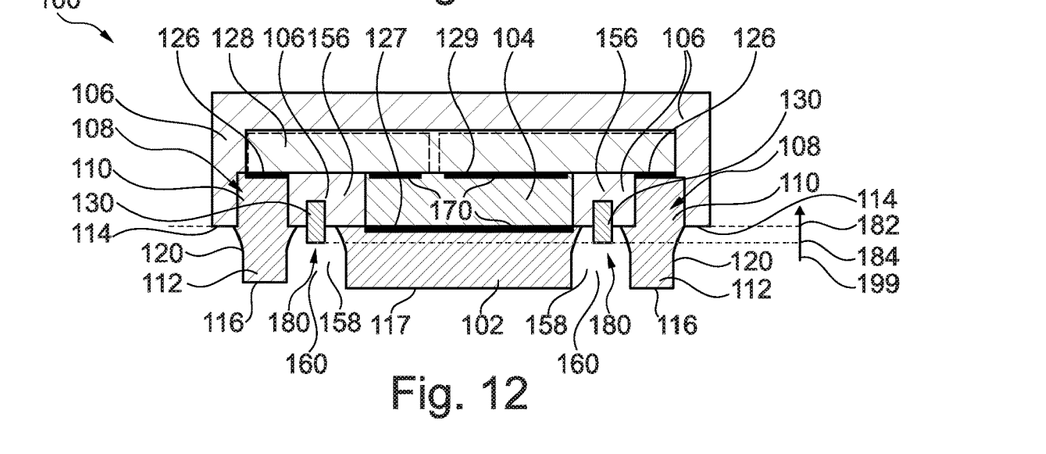

FIG. 10 to FIG. 12 show cross-sectional views of structures obtained during carrying out a method of manufacturing a package 100, shown in FIG. 12, according to still another exemplary embodiment. Referring to FIG. 10, metal plate 154 is patterned on its upper side by forming top-sided recesses 156 by half etching, similar as in FIG. 4 but with a different pattern. Referring to FIG. 11, a planar clip is attached as flat electrically conductive connection element 128 on top of the patterned metal plate 154 after assembly of electronic component 104 on the patterned metal plate 154. After encapsulation and now referring to FIG. 12, the carrier 102 and the leads 108 are separated from the metal plate 154 by half etching from its back side. Furthermore, two wall-shaped or one annular extension 130 may be inserted in a recess formed in the bottom side 114 of the encapsulant 106 as a creepage current inhibitor and/or as a solder wetting barrier.

The package 100 according to FIG. 12 differs from the package 100 according to FIG. 3 in particular that, in the embodiment of FIG. 12, a flat planar clip is implemented as electrically conductive connection element 128 for electrically coupling the leads 108 with the electronic component 104. Due to the patterning according to FIG. 10, a top surface 126 of the leads 108 protrudes vertically beyond a top surface 127 of the carrier 102 so that the top surface 126 of the leads 108 are coplanar with a top surface 129 of the electronic component 104. This allows to implement an electrically conductive connection element 128 embodied as flat clip for electrically coupling the top surface 126 of the leads 108 with the top surface 129 of the electronic component 104. The embodiment according to FIG. 12 may hence be denoted as clip-attached die configuration.

Figure 13:
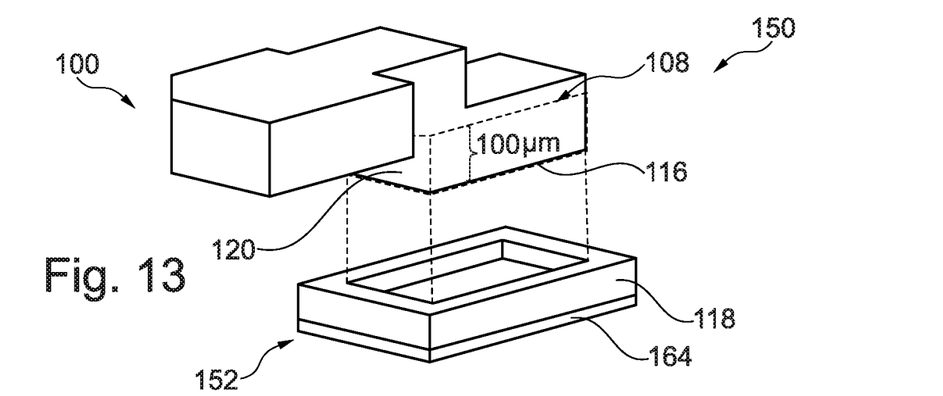
FIG. 13 illustrates an exploded view of part of an electronic device comprising a package with elevated lead according to an exemplary embodiment and to be mounted on a mounting base used as a basis for a simulation.

FIG. 13 illustrates an exploded view of part of an electronic device 150 comprising a package 100 with elevated lead 108 according to an exemplary embodiment and to be mounted on a mounting base 152 used as a basis for a simulation. Improvements which may be achieved with an elevated lead 108 have been investigated by said simulation.

The simulation has been performed for demonstrating that an elevated lead 108, protruding for instance by 100 µm downwardly, is reducing the accumulation of creep strain (volume averaged over control volumes) during a last thermal cycle by 60% compared to a conventional lead. As a result, a package 100 with improved reliability may be obtained.

Figure 14:
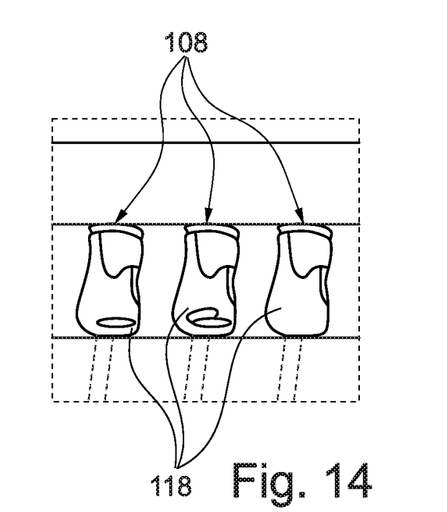
FIG. 14 and FIG. 15 show images of a solder connection between a package with elevated leads and a mounting base according to exemplary embodiments.
Figure 15:
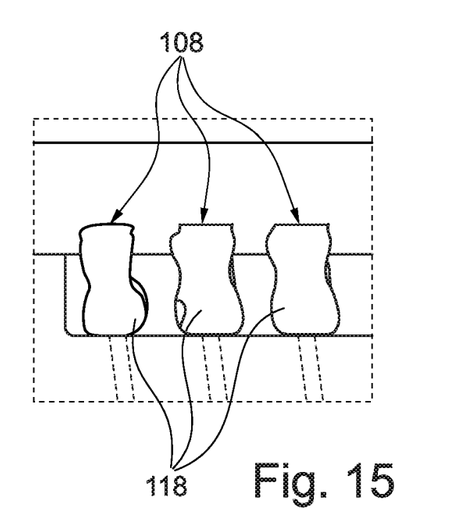

FIG. 14 and FIG. 15 show images of a solder connection between a package 100 with elevated leads 108 and a mounting base 152 according to exemplary embodiments. FIG. 14 and FIG. 15 show two investigated versions. According to FIG. 14, the sidewall is wetted. In FIG. 15, the sidewall wetting was suppressed. The result of the board level reliability is that removing sidewall wetting may lead to a reduction of reliability by for instance 25%. A strong improvement can therefore be obtained by embedding leads 108 from all four sides in solder.

Figure 16:
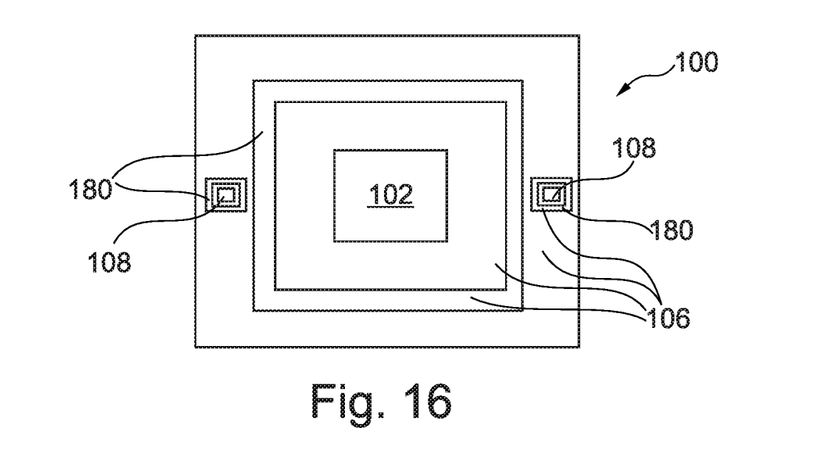
FIG. 16 illustrates a bottom view of a package according to an exemplary embodiment.

FIG. 16 illustrates a bottom view of a package 100 according to an exemplary embodiment. According to FIG. 16, the functional structure 180 comprises an annular structure surrounding the carrier 102. Furthermore, the functional structure 180 of FIG. 16 is integrally formed with the encapsulant 106, i.e. is embodied as mold protrusion(s). Functional structure 180 may comprise a rectangular wall, but may alternatively comprise a circular wall. Another rectangular or circular mold protrusion may surround a respective lead 108, also forming part of functional structure 180.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, wherein the package comprises:
    a carrier;
    an electronic component mounted on the carrier;
    an encapsulant encapsulating at least part of the electronic component and at least part of the carrier and having a bottom side at a first vertical level;
    at least one lead electrically coupled with the electronic component and comprising a first lead portion being encapsulated in the encapsulant and a second lead portion extending out of the encapsulant at said bottom side of the encapsulant; and
    a functional structure at said bottom side extending up to a second vertical level being different from said first vertical level,
    wherein the functional structure comprises at least one extension extending downwardly from said bottom side, wherein the second lead portion protrudes vertically beyond the at least one extension, wherein the at least one extension forms part of said encapsulant, and wherein a gap separates the at least one extension from the second lead portion.

2. The package according to claim 1, wherein the functional structure further comprises at least one recess extending from said bottom side upwardly into the encapsulant.

3. The package according to claim 1, comprising a plurality of leads each electrically coupled with the electronic component and each comprising a first lead portion being encapsulated in the encapsulant and a second lead portion extending out of the encapsulant at said bottom side of the encapsulant.

4. The package according to claim 3, wherein the functional structure is arranged laterally between different ones of the leads.

5. The package according to claim 1, wherein the carrier comprises a first carrier portion being encapsulated in the encapsulant and a second carrier portion extending out of the encapsulant at said bottom side of the encapsulant.

6. The package according to claim 1, wherein the functional structure is arranged laterally between the carrier and the at least one lead.

7. The package according to claim 1, comprising at least one of the following features:
   wherein the functional structure is configured for extending a creepage distance along an exterior surface of the encapsulant; and
   wherein the functional structure is delimited by a material being non-wettable by solder material.

8. The package according to claim 1, comprising at least one of the following features:
   wherein the functional structure is a wall-shaped structure;
   wherein the functional structure comprises an annular structure;
   wherein the second lead portion extends out of the encapsulant exclusively at said bottom side;
   wherein the second lead portion, in particular the entire at least one lead, extends substantially vertically;
   wherein the second lead portion tapers from the bottom side of the encapsulant towards a bottom surface of the second lead portion; and
   the package is configured as leadless package.

9. The package according to claim 1, wherein a top surface of the at least one lead protrudes beyond a top surface of the carrier, in particular so that the top surface of the at least one lead is coplanar with a top surface of the electronic component.

10. The package according to claim 9, comprising at least one electrically conductive connection element, in particular at least one clip, electrically coupling the top surface of the at least one lead with a top surface of the electronic component.

11. An electronic device, comprising:
   a package according to claim 1; and
   a mounting base on which the package is mounted and being electrically coupled with the at least one lead.

12. The electronic device according to claim 11, comprising an electrically conductive connection medium, in particular solder material, by which the mounting base is electrically coupled with the at least one lead.

13. A method of manufacturing a package, wherein the method comprises:
   mounting an electronic component on a carrier;
   electrically coupling at least one lead with the electronic component;
   encapsulating at least part of the electronic component and at least part of the carrier by an encapsulant which has a bottom side at a first vertical level;
   encapsulating only a first lead portion of the at least one lead in the encapsulant so that a second lead portion of the at least one lead extends out of the encapsulant at said bottom side of the encapsulant; and
   forming a functional structure at said bottom side extending up to a second vertical level being different from said first vertical level, wherein the functional structure comprises at least one extension extending downwardly from said bottom side, wherein the second lead portion protrudes vertically beyond the at least one extension, wherein the at least one extension forms part of the encapsulant, and wherein a gap separates the at least one extension from the second lead portion.

14. The method according to claim 13, wherein the method comprises forming the carrier and the at least one lead by patterning a metal sheet, in particular by etching, more particularly by a first partial etching of a top side and a second partial etching of a bottom side of the metal sheet.

15. The method according to claim 13, wherein the method comprises:
   forming at least one top-side recess in an upper main surface of a metal sheet;
   thereafter mounting the electronic component on the metal sheet;
   thereafter encapsulating an upper portion of the metal sheet and at least part of the electronic component; and
   thereafter forming at least one bottom-side recess in a lower main surface of the metal sheet so that the at least one top-side recess and the at least one bottom-side recess are connected to form at least one through hole separating the metal sheet into the carrier and the at least one lead.

16. The method according to claim 15, wherein the method comprises:
   forming the at least one top-side recess with a tapering or stepped profile;
   at least partially filling said tapering or stepped profile with encapsulant during encapsulating to thereby form the functional structure as at least one extension of the encapsulant; and
   exposing the at least one extension by forming said at least one bottom-side recess.

* * * * *